United States Patent
Sunairi

(10) Patent No.: US 7,924,094 B2
(45) Date of Patent: Apr. 12, 2011

(54) AMPLIFIER AND OFFSET REGULATING CIRCUIT

(75) Inventor: Souji Sunairi, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/437,948

(22) Filed: May 8, 2009

(65) Prior Publication Data

US 2009/0295479 A1 Dec. 3, 2009

(30) Foreign Application Priority Data

Jun. 2, 2008 (JP) ................................. 2008-144374

(51) Int. Cl.
*H03F 3/45* (2006.01)

(52) U.S. Cl. ....................................... 330/258; 330/257

(58) Field of Classification Search .................. 330/253, 330/257, 258
See application file for complete search history.

(56) References Cited

U.S. PATENT DOCUMENTS 5,856,757 A * 1/1999 Eschauzier .................... 330/258
6,774,722 B2 * 8/2004 Hogervorst .................... 330/258

FOREIGN PATENT DOCUMENTS

JP 2007-134940 A 5/2007

* cited by examiner

*Primary Examiner* — Khanh V Nguyen
(74) *Attorney, Agent, or Firm* — Sughrue Mion, PLLC

(57) ABSTRACT

An amplifier includes a signal amplification part that outputs an output signal obtained by amplifying an input signal and a common mode voltage $V_{CM}$ of the output signal, and a common mode feedback part that outputs a signal according to a difference between the common mode voltage $V_{CM}$ and a reference potential $V_{ref}$ as a regulation signal $S_{REG}$. The regulation signal $S_{REG}$ from the common mode feedback part is fed back to a current source of the signal amplification part and a current source of the common mode feedback part.

4 Claims, 7 Drawing Sheets

AMPLIFIER AND OFFSET REGULATING CIRCUIT

BACKGROUND

1. Field of the Invention

The present invention relates to an amplifier and an offset regulating circuit.

2. Description of Related Art

A fully differential amplifier has been known. FIG. 7 shows an outline view of the fully differential amplifier.

As shown in FIG. 7, a fully differential amplifier 10 includes two input terminals 11, 12, two output terminals 13, 14, and a reference voltage input terminal 15.

Each of input signals input from the input terminals 11, 12 is amplified and the amplified signals are output from the output terminals 13 and 14.

Here, a reference voltage $V_{ref}$ is input from the reference voltage input terminal 15. Then, output signals $V_{OP}$, $V_{ON}$ from the output terminals 13, 14 are differential mode components, where the magnitudes of the output signals are equal to each other and the sign are opposite to each other with the reference voltage $V_{ref}$ therebetween. In other words, by regulating the reference voltage $V_{ref}$, the common mode level of the output signals $V_{OP}$, $V_{ON}$ can be shifted regardless of the common mode level of the input signals. For example, the dynamic range of the output signals $V_{OP}$, $V_{ON}$ can be regulated to the range that is optimal to the circuit that is provided in the downstream of the fully differential amplifier 10.

FIG. 8 shows an internal configuration of the fully differential amplifier 10 according to a related art.

The fully differential amplifier 10 includes a signal amplification part 20, a common mode feedback part 30, a first current source 40, and a second current source 50.

The signal amplification part 20 is supplied with a power supply current from the first current source 40, and amplifies the input signals input from the input terminals 11, 12 to output the amplified signals from the output terminals 13, 14. Further, the signal amplification part 20 outputs a common mode voltage $V_{CM}$ between $V_{op}$ and $V_{on}$.

The common mode feedback part 30 is supplied with an operating current from the second current source 50. Then, the common mode feedback part 30 compares the reference voltage $V_{ref}$ with the common mode voltage $V_{CM}$, and feeds back the comparing result as $V_{REG}$ to the first current source 40 which is the current source of the signal amplification part 20.

As such, the common mode voltage $V_{CM}$ is controlled to match the reference voltage $V_{ref}$ by the common mode feedback part 30.

For example, when the common mode voltage $V_{CM}$ is smaller than the reference voltage $V_{ref}$, the signal $V_{REG}$ is fed back to the first current source 40 so that larger current flows in the signal amplification part 20.

Further, when the common mode voltage $V_{CM}$ is larger than the reference voltage $V_{ref}$, the signal $V_{REG}$ is fed back to the first current source 40 so that smaller current flows in the signal amplification part 20.

By employing such a configuration, the common mode voltage $V_{CM}$ of the output voltage signals $V_{OP}$, $V_{ON}$ matches the reference voltage $V_{ref}$, and the output of the differential mode with a center of the reference voltage $V_{ref}$ can be obtained.

For example, Japanese Unexamined Patent Application Publication No. 2007-134940 discloses the configuration to feed back the output of the common mode feedback part 30 to the current source (first current source 40) of the signal amplification part 20.

SUMMARY

However, the present inventors have found a problem that, the related configuration does not have sufficient ability to make the common mode voltage $V_{CM}$ follow the reference voltage $V_{ref}$. In this case, as the signal cannot be obtained with a desired range, the relay to a later circuit cannot be successfully performed.

Furthermore, the power supply ability may be fluctuated, for example.

To be more specific, the ability of the transistor that forms the first current source 40 may vary due to the fluctuation of the environment temperature or the like. Then, the current that is supplied from the first current source 40 to the signal amplification part 20 may be fluctuated, which causes the fluctuation of the amplification rate or the like of the signal in the signal amplification part 20. As a result, the common mode voltage $V_{CM}$ of the output signal also varies.

In this case, it is possible to some extent to compensate for fluctuation of the transistor by feeding back the regulation signal $V_{REG}$ from the common mode feedback part 30 to the first current source 40.

However, when the ability of the transistor that forms the first current source 40 is fluctuated, only the limited effect can be obtained as the regulation ability by the transistor is also fluctuated even when the feedback signal is fed back to the transistor of the first current source 40.

It may be possible to increase the ability of the transistor in order to solve this problem. However, the transistor needs to be made larger in order to increase the ability of the transistor, which requires larger space.

A first exemplary aspect of an embodiment of the present invention is an amplifier that amplifies an input signal to output an output signal, and regulates a central voltage of the output signal according to a reference voltage Vref that is independently and externally input, the amplifier including an amplification part that outputs the output signal obtained by amplifying the input signal and the central voltage of the output signal, and an offset regulating part that outputs a signal according to a difference between the central voltage and the reference voltage as a regulation signal, in which the regulation signal from the offset regulating part is fed back to a current source of the amplification part and a current source of the offset regulating part.

In the device thus constructed, the regulation signal from the offset regulating part is fed back not only to the current source of the amplification part but also to the current source of the offset regulating part. Thus, the current supplied to the offset regulating part is also regulated by the regulation signal. Then, the operating current of the offset regulating part also fluctuates in accordance with the central voltage of the output of the amplification part, and the regulation signal greatly varies in accordance with the fluctuation of the central voltage.

As the regulation signal dynamically responds to the fluctuation of the central voltage, the regulation ability by the regulation signal increases. For example, even when the power supply ability is fluctuated, the regulation ability so as to be able to completely compensate for the fluctuation can be obtained by the fluctuation of the regulation signal.

Further, as high regulation ability can be realized by the regulation signal, the ability of the transistor element that forms this circuit needs not be made higher than required. As a result, miniaturization of the circuit can be realized while keeping the stability of the circuit.

Further, the regulation signal is fed back not only to the current source of the amplification part but also to the current source of the offset regulating part, whereby the regulation signal itself can dynamically and quickly respond to the fluctuation of the central voltage. Accordingly, the transient state can be quickly recovered to the steady state. For example, even when the input signal includes noise, quick recovery is possible and the stable circuit can be obtained.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
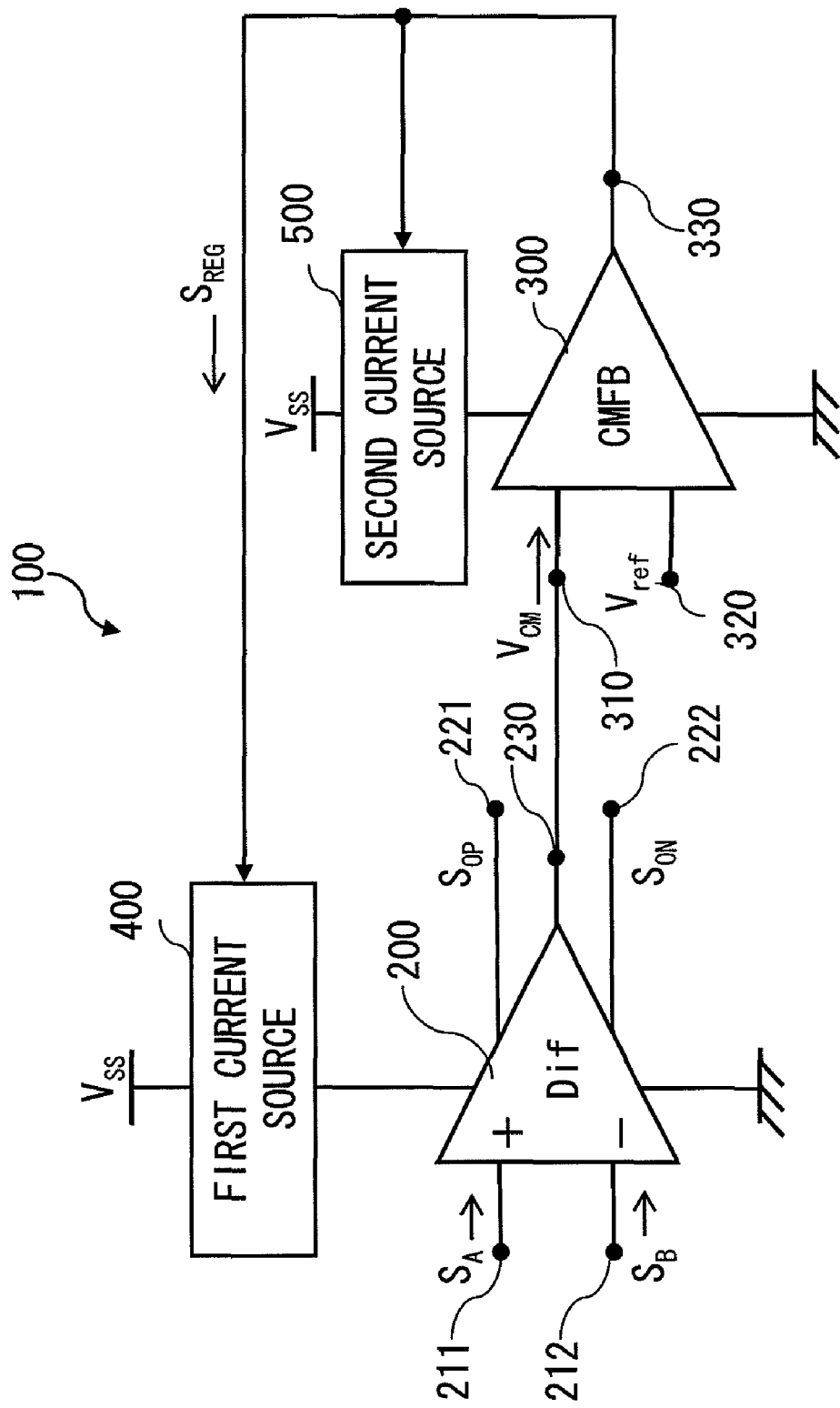
FIG. 1 shows a schematic configuration of a fully differential amplifier as an amplifier according to a first exemplary embodiment.

FIG. 1 shows a schematic configuration of a fully differential amplifier as an amplifier according to the first exemplary embodiment of the present invention.

A fully differential amplifier 100 includes a signal amplification part (amplification part) 200, a common mode feedback part (offset regulating part) 300, a first current source 400, and a second current source 500.

The signal amplification part (amplification part) 200 outputs two output signals $S_{OP}$, $S_{ON}$ of differential mode components that are obtained by amplifying two input signals $S_A$, $S_B$.

The common mode feedback part (offset regulating part) 300 regulates a common mode voltage $V_{CM}$ (central voltage) of the output signals $S_{OP}$, $S_{ON}$ from the signal amplification part 200 so that the common mode voltage $V_{CM}$ matches a reference voltage $V_{ref}$ that is externally set.

The first current source 400 supplies an operating current to the signal amplification part 200.

The second current source 500 supplies an operating current to the common mode feedback part 300.

The signal amplification part 200 includes input terminals 211, 212 to which the two input signals $S_A$, $S_B$ are input, and output terminals 221, 222 outputting the two output signals $S_{OP}$, $S_{ON}$.

Further, the signal amplification part 200 includes a common mode voltage output terminal 230 outputting the common mode voltage $V_{CM}$ of the output signals $S_{OP}$, $S_{ON}$.

The signal amplification part 200 is supplied with the operating current from the first current source 400. The first current source 400 is connected to a high-potential side power supply potential $V_{SS}$, and the signal amplification part 200 is connected to a low-potential side power supply potential GND.

The common mode feedback part 300 includes a common mode voltage input terminal 310, a reference voltage input terminal 320, and a regulation signal output terminal 330.

The common mode voltage input terminal 310 receives the common mode voltage $V_{CM}$ from the common mode voltage output terminal 230 of the signal amplification part 200.

The reference voltage input terminal 320 receives the reference voltage $V_{ref}$.

The regulation signal output terminal 330 outputs a regulation signal $S_{REG}$ to feedback control the level of the common mode voltage $V_{CM}$. The common mode feedback part 300 is supplied with the operating current from the second current source 500. The second current source 500 is connected to a high-potential side power supply potential $V_{SS}$, and the common mode feedback part 300 is connected to a low-potential side power supply potential GND.

Then, the regulation signal $S_{REG}$ output from the regulation signal output terminal 330 of the common mode feedback part 300 is feedback input to the first current source 400 and the second current source 500.

Figure 2:
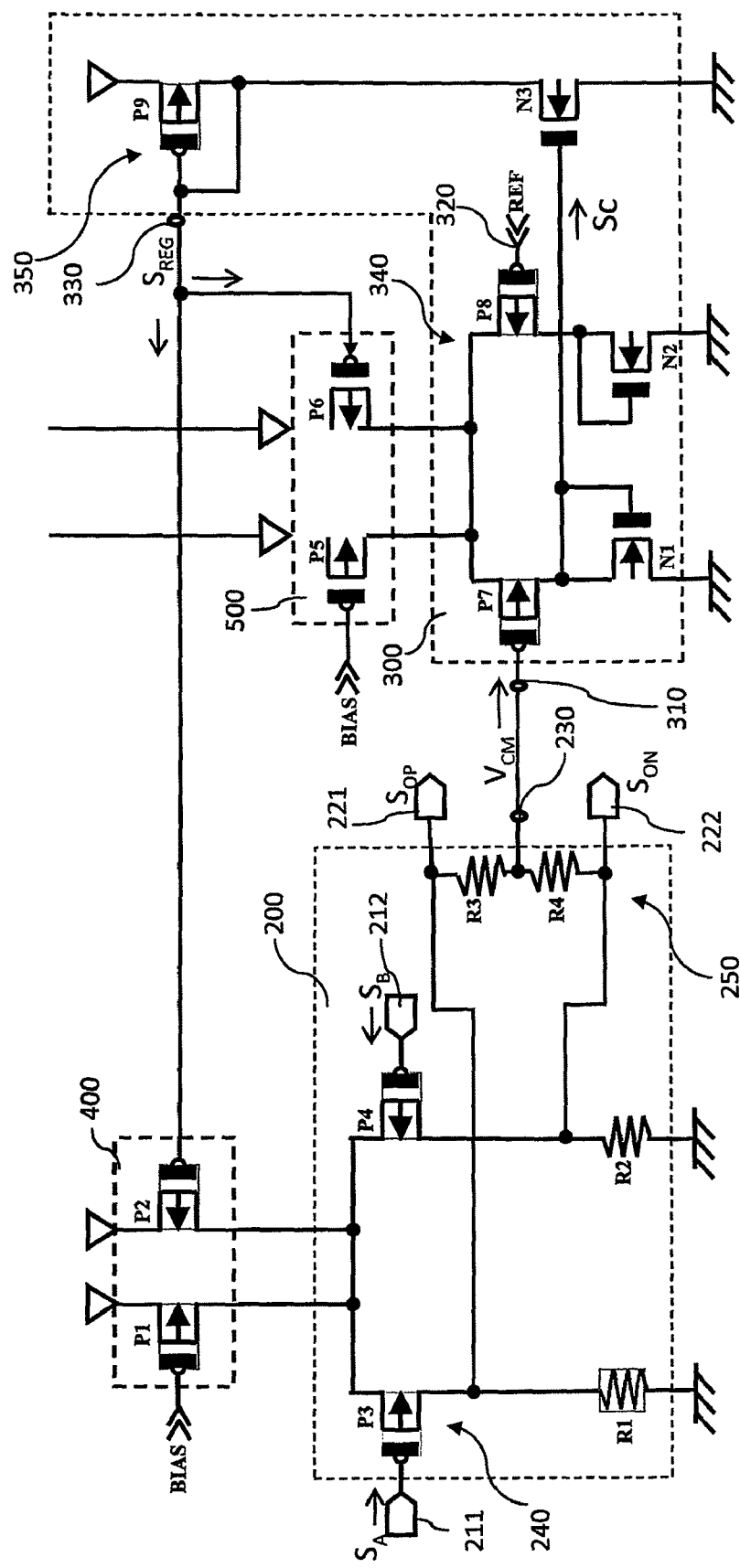
FIG. 2 shows a detailed circuit configuration of the fully differential amplifier.

Referring now to FIG. 2, the configuration of the fully differential amplifier 100 will be described in more detail.

FIG. 2 shows a detailed circuit configuration of the fully differential amplifier 100.

The first current source 400 includes two p channel MOS transistors (pMOS transistors) $P_1$ and $P_2$.

One pMOS transistor $P_1$ includes a gate to which a bias is applied, and a source connected to the power supply potential $V_{SS}$.

Further, the other pMOS transistor $P_2$ includes a gate to which the regulation signal $S_{REG}$ from the common mode feedback part 300 is applied, and a source connected to the power supply potential $V_{SS}$.

The signal amplification part 200 includes a differential pair 240 and a signal output part 250.

Each of the two input signals $S_A$, $S_B$ is input to each gate of the differential pair 240, and the differential pair 240 amplifies each of the input signals $S_A$, $S_B$.

The signal output part 250 outputs the signals from the differential pair 240.

The differential pair 240 is composed of two pMOS transistors $P_3$, $P_4$.

Each gate of the pMOS transistors $P_3$, $P_4$ includes an input terminal, and the input signals $S_A$, $S_B$ are input to each gate through the input terminals 211, 212.

The sources of the pMOS transistors $P_3$, $P_4$ are connected together, and the source of the pMOS transistor $P_3$ and the source of the pMOS transistor $P_4$ are connected to the first current source 400.

In short, the source of the pMOS transistor $P_3$ and the source of the pMOS transistor $P_4$ are connected to drains of the pMOS transistor $P_1$ and the pMOS transistor $P_2$ of the first current source 400. Accordingly, the operating current is supplied to the differential pair 240.

Further, a drain of the pMOS transistor $P_3$ is connected to the power supply potential GND through a resistor $R_1$, and a drain of the pMOS transistor $P_4$ is connected to the power supply potential GND through a resistor $R_2$.

The resistors $R_1$ and $R_2$ have the same value.

The signal output part 250 includes a first output terminal 221, a second output terminal 222, and a common mode voltage output terminal 230.

The first output terminal 221 outputs the output signal $S_{OP}$ obtained by amplifying one input signal $S_A$.

The second output terminal 222 outputs the output signal $S_{ON}$ obtained by amplifying the other input signal $S_B$.

The common mode voltage output terminal 230 outputs the common mode voltage $V_{CM}$ of the output signal $S_{OP}$ and the output signal $S_{ON}$. The first output terminal 221 is drawn from the drain of one pMOS transistor $P_3$ that forms the differential pair 240.

The second output terminal 222 is drawn from the drain of the other pMOS transistor $P_4$ that forms the differential pair 240.

Further, resistors $R_3$ and $R_4$ are provided in series between the first output terminal 221 and the second output terminal 222.

Then, the common mode voltage output terminal 230 is drawn from a part between the resistors $R_3$ and $R_4$.

The resistors $R_3$ and $R_4$ have the same value having the high resistance value.

The second current source 500 includes two pMOS transistors $P_5$, $P_6$.

One pMOS transistor $P_5$ includes a gate to which a bias is applied, and a source connected to the power supply potential $V_{SS}$.

The other PMOS transistor $P_6$ includes a gate to which the regulation signal $S_{REG}$ from the common mode feedback part 300 is applied, and a source connected to the power supply potential $V_{SS}$.

The common mode feedback part 300 includes a differential pair 340 and a regulation signal output part 350.

The differential pair 340 includes a gate to which the common mode voltage $V_{CM}$ from the signal amplification part 200 is input and a gate to which the reference voltage $V_{ref}$ from an external part is input, so as to generate a differential signal Sc obtained by amplifying the difference of these signals.

The regulation signal output part 350 outputs the differential signal Sc from the differential pair 340 as the regulation signal $S_{REG}$.

The differential pair 340 is composed of two pMOS transistors $P_7$, $P_8$.

The common mode voltage $V_{CM}$ from the signal amplification part 200 is applied to a gate of the pMOS transistor $P_7$.

The reference voltage $V_{ref}$ is applied to a gate of the pMOS transistor $P_8$.

Sources of the pMOS transistors $P_7$, $P_8$ are connected together, and the source of the pMOS transistor $P_7$ and the source of the pMOS transistor $P_8$ are connected to the second current source 500. In summary, the source of the PMOS transistor $P_7$ and the source of the pMOS transistor $P_8$ are connected to drains of the pMOS transistor $P_5$ and the pMOS transistor $P_6$ of the second current source 500. Thus, the operating current is supplied to the differential pair 340.

Further, an n channel MOS transistor (nMOS transistor) $N_1$ is provided between a drain of the pMOS transistor $P_7$ and the power supply potential GND. Then, a drain and a gate of the nMOS transistor $N_1$ are connected to the drain of the pMOS transistor $P_7$, and a source of the nMOS transistor $N_1$ is connected to the power supply potential GND.

On the other hand, an nMOS transistor $N_2$ is provided between a drain of the pMOS transistor $P_8$ and the power supply potential GND.

Then, a drain and a gate of the nMOS transistor $N_2$ are connected to the drain of the pMOS transistor $P_8$, and a source of the nMOS transistor $N_2$ is connected to the power supply potential GND.

The regulation signal output part 350 includes an nMOS transistor $N_3$ amplifying the differential signal Sc from the differential pair 340, and a pMOS transistor $P_9$ that forms the current source of the regulation signal output part 350.

The differential signal Sc drawn from the source of the pMOS transistor $P_7$ of the differential pair 340 is applied to a gate of the nMOS transistor $N_3$.

Note that the drain and the gate of the nMOS transistor $N_1$ and the gate of the nMOS transistor $N_3$ are connected to the source of the pMOS transistor $P_7$, and the nMOS transistor $N_1$ and the nMOS transistor $N_3$ form a current mirror circuit.

A source of the nMOS transistor $N_3$ is connected to the power supply potential GND, and a drain of the nMOS transistor $N_3$ is connected to a drain and a gate of the pMOS transistor $P_9$.

Then, a source of the PMOS transistor $P_9$ is connected to the power supply potential $V_{SS}$.

The drain of the nMOS transistor $N_3$ is input to the drain and the gate of the pMOS transistor $P_9$, and the regulation signal $S_{REG}$ is divided from a signal line connecting between the drain and the gate of the pMOS transistor $P_9$.

Then, as described above, the regulation signal $S_{REG}$ is feedback input to the first current source 400 and the second current source 500, and is input to the gate of the pMOS transistor $P_2$ of the first current source 400 and the gate of the pMOS transistor $P_6$ of the second current source.

Accordingly, the pMOS transistor $P_9$ of the regulation signal output part 350 and the pMOS transistor $P_2$ of the first current source 400 form a current mirror circuit. Similarly, the pMOS transistor $P_9$ of the regulation signal output part 350 and the pMOS transistor $P_6$ of the second current source 500 form a current mirror circuit.

Note that a performance value of each transistor and a resistance value of each resistor are designed so that the common mode voltage $V_{CM}$ matches the reference voltage $V_{ref}$ input from outside in a steady state.

When the current supplied from the first current source to the signal amplification part is Ia, the resistance value of the resistor $R_1$ is $R_1$, and the resistance value of the resistor $R_2$ is $R_2$, under a typical condition, the design is made to satisfy the following expression.

$$V_{ref}=V_{CM}=R_1 \times Ia/2 = R_2 \times Ia/2$$

Now, the operation of the fully differential amplifier 100 having such a configuration will be described.

First, in a normal operation, the input signals $S_A$, $S_B$ are input from the input terminals 211, 212.

Then, the input signals $S_A$, $S_B$ are amplified by the pMOS transistor $P_3$ and the pMOS transistor $P_4$, respectively, that form the differential pair 240.

The signals that are amplified are output from the output terminals 221, 222 as the output signals $S_{OP}$, $S_{ON}$.

At this time, the common mode voltage ($V_{CM}=(V_{SOP}+V_{SON})/2$) of the output signals $S_{OP}$, $S_{ON}$ matches the reference voltage $V_{ref}$ that is externally input.

A further detailed operation will now be described.

The process to reach the steady state after passing through the transient operation when the environment or the device characteristics is fluctuated will be described.

A case in which the current supplied from the first current source 400 is decreased will be described.

Assume a case in which the ability (amplification rate) of the pMOS transistor (at least any one of the pMOS transistor $P_1$ and the pMOS transistor $P_2$) that forms the first current source 400 is decreased due to the variation of the process, the temperature fluctuation, the fluctuation of the power supply voltage or the like.

In this case, the current Ia that is supplied from the first current source 400 to the signal amplification part 200 is decreased.

Then, the voltage value of the output signals $S_{OP}$, $S_{ON}$ is decreased even when the amplification rate or the signal waveform is accurate.

In short, the common mode voltage $V_{CM}$ of the output signals $S_{OP}$, $S_{ON}$ is decreased, and is deviated from the reference voltage $V_{ref}$.

At this time, in the common mode feedback part 300, the common mode voltage $V_{CM}$ and the reference voltage $V_{ref}$ are input to the pMOS transistor $P_7$ and the pMOS transistor $P_8$, respectively, that form the differential pair 340. When the common mode voltage $V_{CM}$ is lower than the reference voltage $V_{ref}$, the current flowed by the pMOS transistor $P_7$ having a gate to which the common mode voltage $V_{CM}$ is applied is increased.

Then, the current that flows in the nMOS transistor $N_1$ and the nMOS transistor $N_3$ is increased. As the current that flows in the nMOS transistor $N_3$ is increased, the voltage of the regulation signal $S_{REG}$ is decreased.

This regulation signal $S_{REG}$ is applied to the gate of the pMOS transistor $P_2$ of the first current source 400.

Then, the current supplied by the first current source 400 to the differential pair 240 of the signal amplification part 200 is increased, and the common mode voltage $V_{CM}$ of the output signals $S_{OP}$, $S_{ON}$ becomes high and is closer to the reference voltage $V_{ref}$.

The regulation signal $S_{REG}$ is fed back to the first current source 400 and to the second current source 500. In short, the regulation signal $S_{REG}$ is applied to the gate of the pMOS transistor $P_6$ of the second current source 500.

When the voltage of the regulation signal $S_{REG}$ is decreased, the current flowed by the pMOS transistor $P_6$ is increased and the current supplied from the second current source 500 to the common mode feedback part 300 is increased. Then, the current that flows in the PMOS transistor $P_7$ of the differential pair 340 is increased when the common mode voltage $V_{CM}$ is smaller than the reference voltage $V_{ref}$.

When the current that flows in the pMOS transistor $P_7$ increases, the voltage of the regulation signal $S_{REG}$ decreases by the corresponding amount of increase due to the operation as above.

As stated above, the current supplied from the first current source 400 increases when the voltage of the regulation signal $S_{REG}$ decreases, and therefore, the voltage of the common mode voltage $V_{CM}$ of the output signals $S_{OP}$, $S_{ON}$ increases to be closer to the reference voltage $V_{ref}$.

When the common mode voltage $V_{CM}$ is lower than the reference voltage $V_{ref}$, the above operation is continued. Then, the operation is made steady when the common mode voltage $V_{CM}$ matches the reference voltage $V_{ref}$ and the state in which the common mode voltage $V_{CM}$ matches the reference voltage $V_{ref}$ is maintained.

Next, a case in which the current supplied from the first current source 400 increases will be described.

Assume a case in which the ability (amplification rate) of the PMOS transistor (at least any one of the pMOS transistor $P_1$ and the pMOS transistor $P_2$) that forms the first current source 400 is improved due to the variation of the process, the temperature fluctuation, the fluctuation of the power supply voltage or the like.

In this case, the current Ia that is supplied from the first current source 400 to the signal amplification part 200 increases. Then, the voltage values of the output signals $S_{OP}$, $S_{ON}$ increase, and are deviated from the reference voltage $V_{ref}$.

In the common mode feedback part 300, the common mode voltage $V_{CM}$ and the reference voltage $V_{ref}$ are input to the pMOS transistor $P_7$ and the pMOS transistor $P_8$, respectively. In this case, when the common mode voltage $V_{CM}$ is higher than the reference voltage $V_{ref}$, the current flowed by the pMOS transistor $P_7$ decreases.

Then, the current that flows in the nMOS transistor $N_1$ and the nMOS transistor $N_3$ decreases.

When the current that flows in the nMOS transistor $N_3$ decreases, the voltage of the regulation signal $S_{REG}$ increases.

The regulation signal $S_{REG}$ is applied to the gate of the pMOS transistor $P_2$ of the first current source 400. Then, the current supplied from the first current source 400 to the differential pair 240 of the signal amplification part 200 decreases, and the common mode voltage $V_{CM}$ of the output signals $S_{OP}$, $S_{ON}$ decreases to be closer to the reference voltage $V_{ref}$.

Further, the regulation signal $S_{REG}$ is applied to the gate of the pMOS transistor $P_6$ of the second current source 500.

When the voltage of the regulation signal $S_{REG}$ increases, the current flowed by the pMOS transistor $P_6$ decreases and the current supplied from the second current source 500 to the common mode feedback part 300 decreases. Then, when the common mode voltage $V_{CM}$ is higher than the reference voltage $V_{ref}$, the current flowing in the pMOS transistor $P_7$ of the differential pair 340 decreases.

As stated above, when the current that flows in the pMOS transistor $P_7$ decreases, the voltage of the regulation signal $S_{REG}$ increases by the corresponding amount of decease due to the same operation as above.

As stated above, when the voltage of the regulation signal $S_{REG}$ increases, the current supplied from the first current source 400 decreases. As such, the voltage of the common mode voltage $V_{CM}$ of the output signals $S_{OP}$, $S_{ON}$ decreases to be made closer to the reference voltage $V_{ref}$.

When the common mode voltage $V_{CM}$ is higher than the reference voltage $V_{ref}$, the above operation is continued. Then, the operation is made steady when the common mode voltage $V_{CM}$ matches the reference voltage $V_{ref}$ and the state in which the common mode voltage $V_{CM}$ matches the reference voltage $V_{ref}$ is kept.

Figure 3:
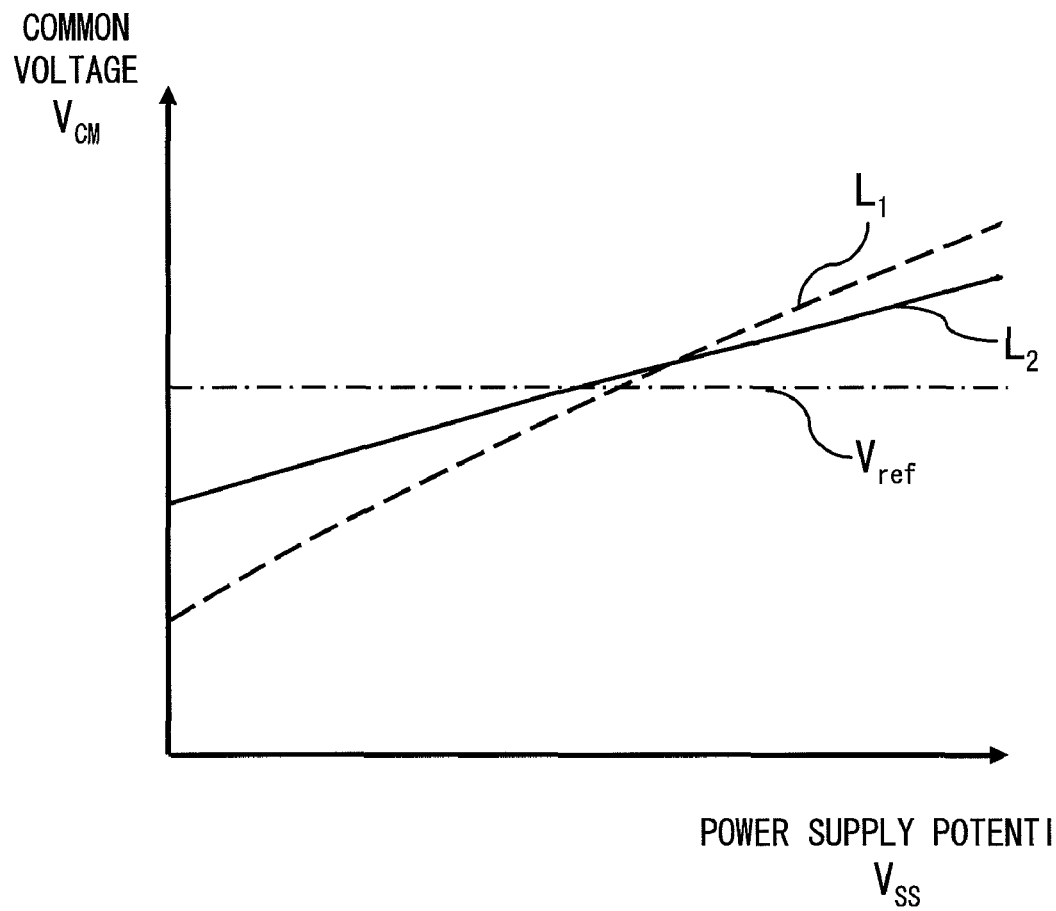
FIG. 3 shows a state of fluctuation of a common mode voltage $V_{CM}$ when a power supply potential $V_{SS}$ is fluctuated.

Now, FIG. 3 shows a state of the fluctuation of the common mode voltage $V_{CM}$ when the power supply potential $V_{SS}$ is fluctuated.

In FIG. 3, the horizontal axis shows the power supply potential $V_{SS}$, and the vertical axis shows the common mode voltage $V_{CM}$.

The state of the fluctuation of the common mode voltage is shown when the reference voltage $V_{ref}$ is constant and the power supply voltage $V_{SS}$ is fluctuated.

In FIG. 3, $L_1$ shows the fluctuation of the common mode voltage in the fully differential amplifier according to the related art, and $L_2$ shows the fluctuation of the common mode voltage $V_{CM}$ in the fully differential amplifier according to the first exemplary embodiment.

As shown in FIG. 3, when the power supply voltage $V_{SS}$ is greatly fluctuated, the common mode voltage $V_{CM}$ is deviated from the reference voltage $V_{ref}$ in both of the related configuration and the configuration of the first exemplary embodiment. However, the configuration according to the first exemplary embodiment has higher follow-up ability compared with the configuration of the related art, and the gap between the common mode voltage $V_{CM}$ and the reference voltage $V_{ref}$ is smaller than that of the related art.

As stated above, according to the first exemplary embodiment, even when the power supply is fluctuated, the common mode voltage $V_{CM}$ can follow the reference voltage $V_{ref}$ with high accuracy in a broader range than the related art.

As a result, for example, the component (transistor or the like) that forms the power supply circuit or the first current source needs not be made larger than needed, and there is an advantage in terms of the size or the manufacturing cost.

Figure 4:
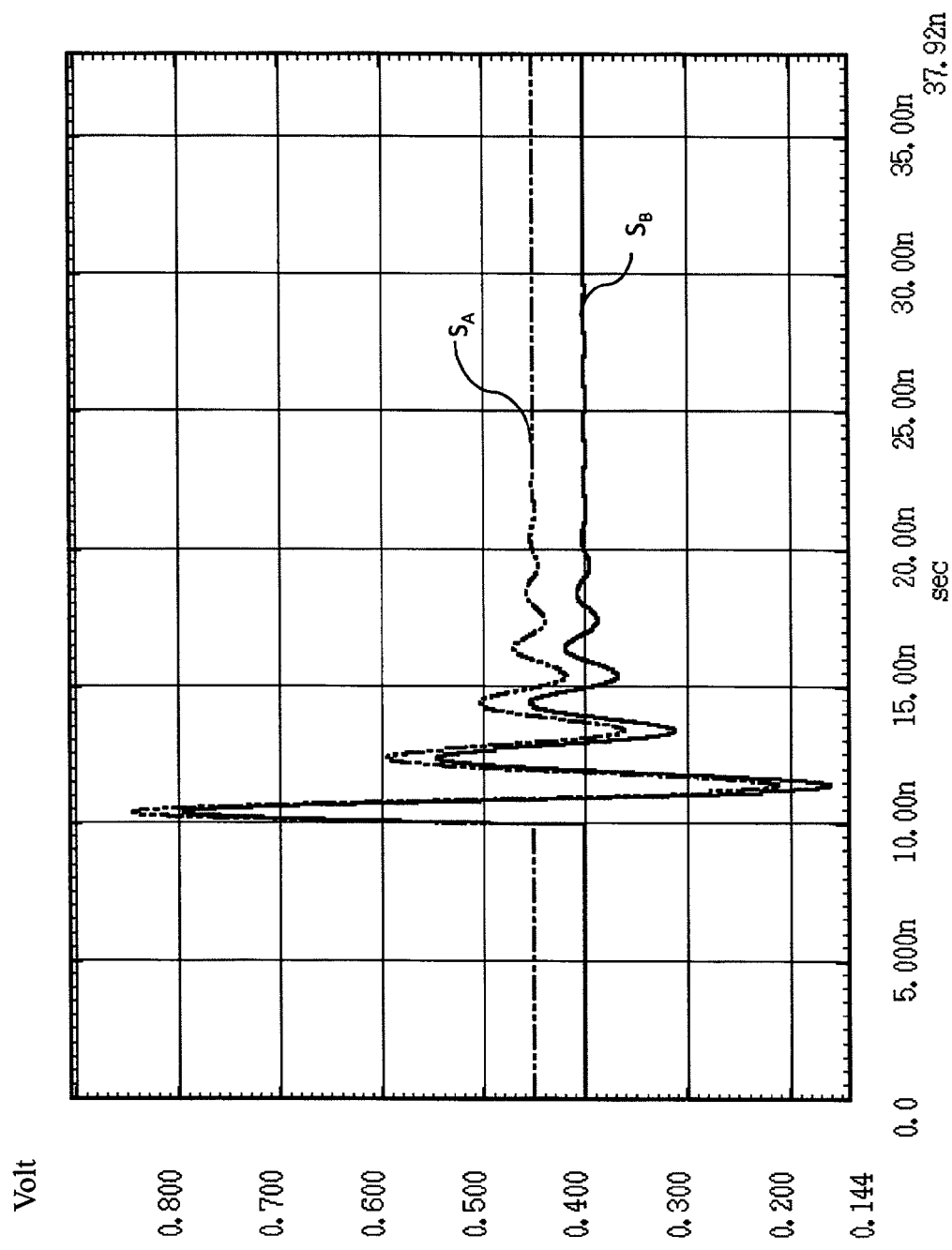
FIG. 4 shows input signals including a noise.
Figure 5:
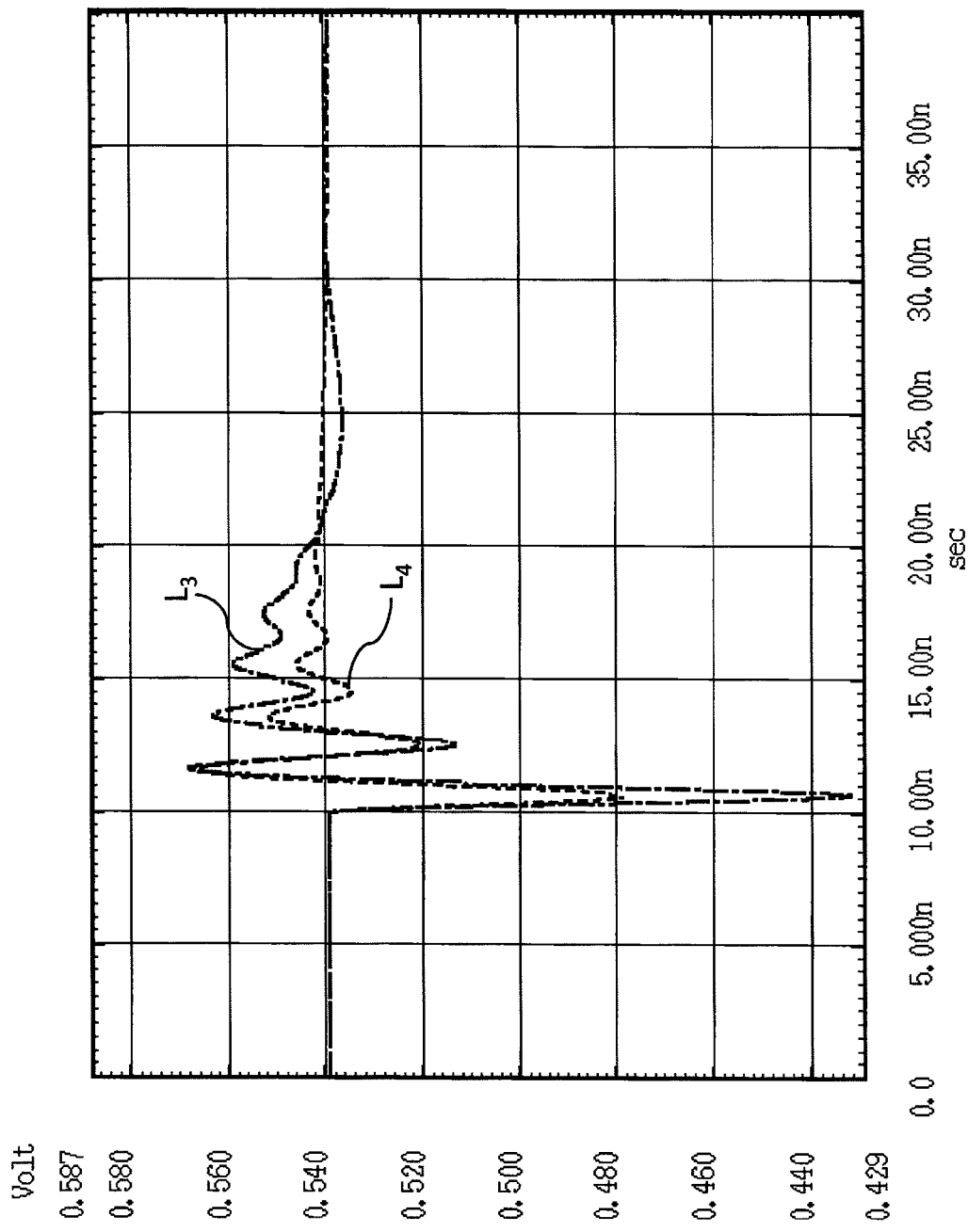
FIG. 5 shows a fluctuation of a common mode voltage when the noise of FIG. 4 is input.

Next, FIGS. 4 and 5 are diagrams explaining the state of the fluctuation of the common mode voltage $V_{CM}$ when the noise is included.

FIG. 4 shows the input signals $S_A$, $S_B$ input to the input terminals 211, 212.

The voltages of 0.45 V and 0.40 V are input to the input terminals 211, 212, respectively. Then, a common-phase noise is added in t=10 ns.

Note that the common-phase noise attenuates, and disappears by t=25 ns.

FIG. 5 shows the fluctuation of the common mode voltage.

In FIG. 5, $L_3$ is the common mode voltage by the fully differential amplifier according to the related configuration, and $L_4$ is the common mode voltage by the fully differential amplifier according to the first exemplary embodiment.

As shown in FIG. 5, when the noise is added to the input signals, the common mode voltage $V_{CM}$ is away from the reference voltage $V_{ref}$ with the configuration of the first exemplary embodiment as well as the related configuration.

However, according to the configuration of the first exemplary embodiment, the speed that the common mode voltage converges to the reference voltage $V_{ref}$ again is high.

In the related configuration, the common mode voltage converges to the reference voltage when t=30 ns. On the other hand, according to the configuration of the first exemplary embodiment, the common mode voltage converges to the reference voltage when t=25 ns.

Further, the overshoot is large according to the related configuration, while the convergence is fast and the overshoot is small according to the configuration of the exemplary embodiment.

According to the first exemplary embodiment having such a configuration, the following effects can be obtained.

(1) As the regulation signal $S_{REG}$ from the common mode feedback part 300 is fed back not only to the first current source but to the second current source, the current supplied from the second current source to the common mode feedback part 300 is regulated with the regulation signal $S_{REG}$.

Then, as the operating current of the common mode feedback part 300 also fluctuates in accordance with the common mode voltage, the regulation signal $S_{REG}$ greatly varies in accordance with the fluctuation of the common mode voltage $V_{CM}$.

Accordingly, the regulation ability by the regulation signal $S_{REG}$ is made high.

For example, even when the power supply ability is fluctuated, the regulation ability so as to be able to completely compensate for the fluctuation can be obtained by the fluctuation of the regulation signal $S_{REG}$.

Accordingly, as described in FIG. 3, high regulation ability can be realized even with the wider change in the power supply part compared with the related configuration.

(2) Further, as high regulation ability can be realized by the regulation signal $S_{REG}$, the ability of the transistor element that forms the circuit does not need to be made higher than needed.

As a result, miniaturization of the circuit can be realized while keeping the stability of the circuit.

(3) The regulation signal $S_{REG}$ is fed back not only to the first current source but to the second current source, whereby the regulation signal itself can dynamically and quickly respond to the fluctuation of $V_{CM}$. Thus, the transient state can be quickly recovered to the steady state. For example, even when the noise is included in the input signal, quick recovery is possible and the stable circuit can be realized.

First Variant Example

Next, the first variant example according to the present invention will be described.

Figure 6:
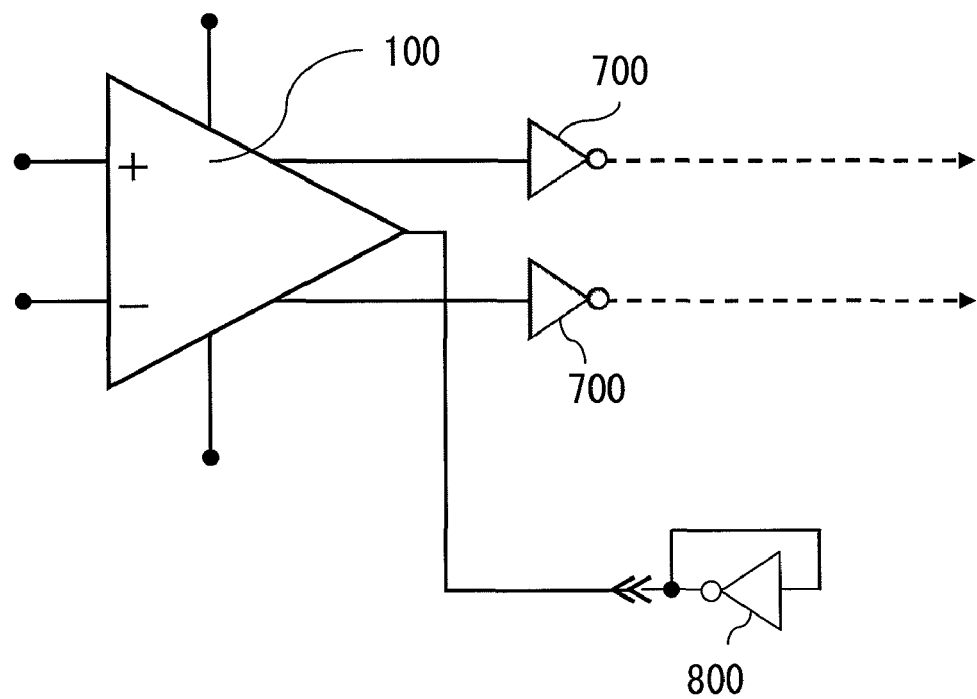
FIG. 6 shows a variant example according to the present invention.
Figure 7:
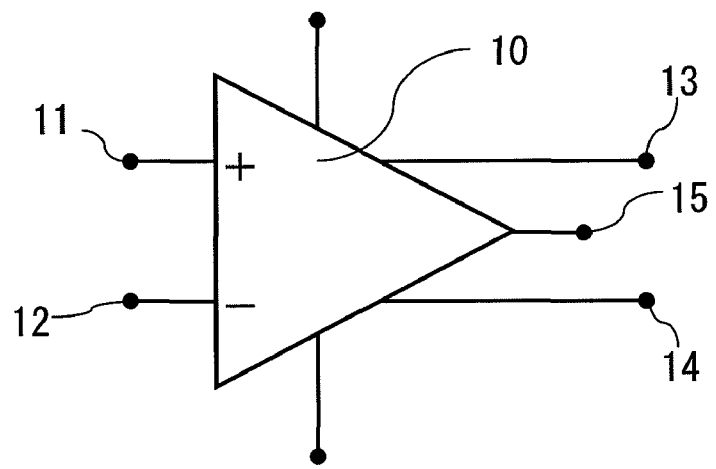
FIG. 7 shows an outline view of the fully differential amplifier.
Figure 8:
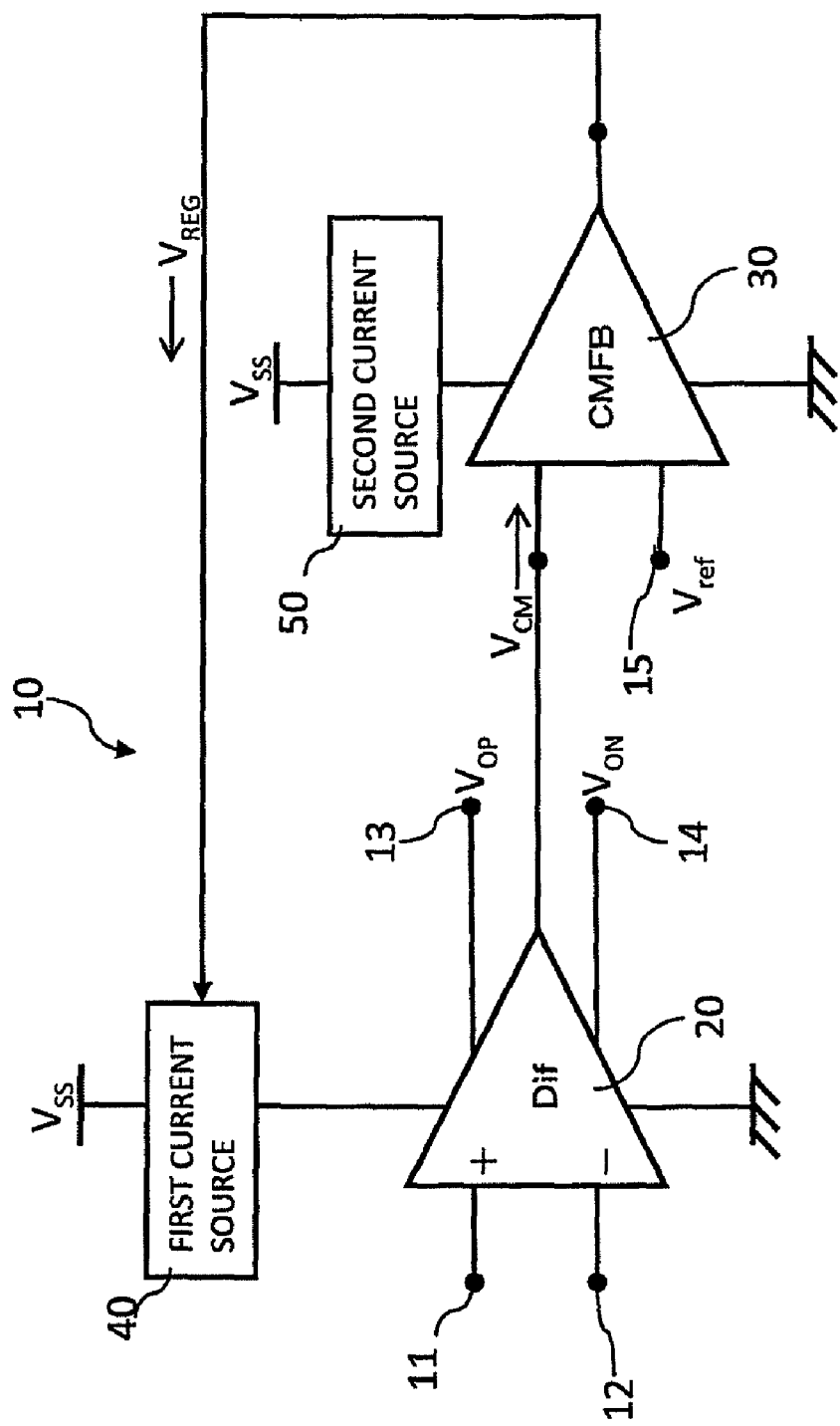
FIG. 8 shows an internal configuration of the fully differential amplifier according to a related art.

When a predetermined inverter circuit is provided in the next stage of the fully differential amplifier, it is preferable to connect a self-biased inverter circuit to the reference voltage input terminal as shown in FIG. 6.

Accordingly, the reference voltage is made equal to the inversion threshold voltage of the inverter.

In FIG. 6, the self-biased inverter is connected as the reference voltage, so as to be able to regulate the common mode voltage $V_{CM}$ to match the inversion threshold value of the inverter that varies due to the fluctuations of the process, temperature, and the power supply voltage.

As a result, the operation of the circuit (inverter circuit) of the next stage is made stable. As a result, a jitter that is observed in the output from the inverter is decreased.

Note that the present invention is not limited to the above exemplary embodiment, but various changes may be made.

In the above exemplary embodiment, the amplification part is assumed to be the fully differential amplifier that outputs two output signals obtained by differentially amplifying the two input signals. However, each of the number of inputs or outputs may not be two. For example, the present invention can be applied to a case in which one of the two terminals is connected to the ground, and thus the single input or the single output is provided.

Needless to say, it is possible to substitute a resistor or a diode for the resistor $R_1$ or the resistor $R_2$, or the nMOS transistor $N_1$ or the nMOS transistor $N_2$ as appropriate.

As the pMOS transistor $P_9$ of the regulation signal output part 350 and the pMOS transistor $P_2$ of the first current source 400 form a current mirror circuit, and the pMOS transistor $P_9$ of the regulation signal output part 350 and the PMOS transistor $P_6$ of the second current source 500 form a current mirror circuit, the regulation signals applied to the pMOS transistor $P_2$ of the first current source 400 and to the pMOS transistor $P_6$ of the second current source 500 are made stable. Further, the amplification rate of the pMOS transistor $P_6$ or the pMOS transistor $P_2$ to the pMOS transistor $P_9$ may be changed as appropriate, so as to change the ratio of the current that flows in the pMOS transistor $P_9$ to the current that flows in the pMOS transistor $P_2$ or the pMOS transistor $P_6$.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An amplifier that amplifies an input signal to output an output signal, and regulates a central voltage of the output signal according to a reference voltage that is independently and externally input, the amplifier comprising:
    an amplification part that outputs an amplified input signal and the central voltage,
    a first current source supplying an operating current to the amplification part;
    an offset regulating part that outputs a regulation signal according to a difference between the central voltage and the reference voltage;
    a second current source supplying an operating current to the offset regulating part, wherein
    the regulation signal from the offset regulating part is fed back to said first current source and said second current source.

2. The amplifier according to claim 1, wherein:
    the amplification part amplifies each of two input signals to output two output signals of differential mode components and outputs a common mode voltage as the central voltage of the two output signals,
    the offset regulating part is a common mode feedback part that outputs the regulation signal according to the difference between the common mode voltage and the reference voltage, and the regulation signal from the common mode feedback part is fed back to said first current source and said second current source.

3. The amplifier according to claim 1, wherein:
    the offset regulating part includes a differential pair and a regulation signal output part, the differential pair including gates to which the central voltage from the amplification part and the reference voltage that is externally input are input to generate a differential signal obtained by amplifying a difference of these signals, the regulation signal output part outputting the differential signal from the differential pair as the regulation signal,
    a transistor that forms a current source of the regulation signal output part and a transistor that forms said first current source form a current mirror, and
    the transistor that forms the current source of the regulation signal output part and a transistor that forms said second current source form a current mirror.

4. An offset regulating circuit that regulates a central voltage of an output signal output from an amplification part according to a reference voltage that is independently and externally input, comprising;
    an offset regulating part that outputs a regulation signal according to a difference between the central voltage and the reference voltage and
    a current source supplying an operating current to the offset regulating part, wherein the regulation signal from the offset regulating part is fed back to said current source.

* * * * *